(12) United States Patent
Milne

(10) Patent No.: US 7,143,369 B1
(45) Date of Patent: Nov. 28, 2006

(54) DESIGN PARTITIONING FOR CO-STIMULATION

(75) Inventor: Roger B. Milne, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 88 days.

(21) Appl. No.: 10/388,936

(22) Filed: Mar. 14, 2003

(51) Int. Cl.
*G06F 17/50* (2006.01)

(52) U.S. Cl. .................... 716/4; 716/5; 703/20; 703/22

(58) Field of Classification Search .................... 716/4, 716/5, 6; 703/13–15, 20, 22
See application file for complete search history.

(56) References Cited

U.S. PATENT DOCUMENTS

| | | | | |
|---|---|---|---|---|
| 6,026,230 | A * | 2/2000 | Lin et al. | 703/13 |
| 6,321,366 | B1 * | 11/2001 | Tseng et al. | 716/6 |
| 6,389,379 | B1 * | 5/2002 | Lin et al. | 703/14 |
| 6,651,225 | B1 * | 11/2003 | Lin et al. | 716/4 |
| 6,725,432 | B1 * | 4/2004 | Chang et al. | 716/4 |
| 2003/0191615 | A1 * | 10/2003 | Bailey et al. | 703/13 |

OTHER PUBLICATIONS

U.S. Appl. No. 10/388,681, filed Mar. 14, 2003, Milne et al.
U.S. Appl. No. 10/389,161, filed Mar. 14, 2003, Milne et al.
U.S. Appl. No. 10/389,368, filed Mar. 14, 2003, Ma et al.
U.S. Appl. No. 09/981,503, filed Oct. 16, 2001, Hwang et al.

* cited by examiner

*Primary Examiner*—Vuthe Siek
(74) *Attorney, Agent, or Firm*—LeRoy D. Maunu; Kim Kanzaki

(57) ABSTRACT

Method and apparatus for simulating operations of a circuit design that includes high-level components and HDL components. Groups of HDL components are associated with different co-simulation engines. The high-level components of the design are simulated in a high-level modeling system (HLMS), and the HDL components in each group are simulated on the associated co-simulation engine.

15 Claims, 4 Drawing Sheets

DESIGN PARTITIONING FOR CO-STIMULATION

FIELD OF THE INVENTION

The present invention generally relates to partitioning electronic circuit designs for co-simulation amongst multiple co-simulation engines.

BACKGROUND

A high level modeling system (HLMS) is a software tool in which electronic designs can be described, simulated, and translated by machine into a design realization. An HLMS provides a higher level of abstraction for describing an electronic circuit than a hardware description language (HDL) simulation environment. An example HDL simulator is provided by the ModelSim tool from the Model Technology company. An HLMS generally provides a mathematical representation of signals as compared to standard logic vectors in a hardware description language (HDL). It is desirable for the high-level abstractions to be precisely correlated with the ultimate implementation representation, both in simulation semantics and in implementation. The Xilinx System Generator tool for DSP and the MathWorks' Simulink and MATLAB environments are example HLMS's in which such capabilities are desirable.

An HLMS for electronic circuit design generally offers abstractions that are not available in traditional HDLs. For example, an HLMS is likely to offer abstractions that relate to signal propagation and signal state, while an HDL may support a detailed representation that more closely models a realized electronic circuit. An electronic design modeled in an HLMS may be viewed as a collection of blocks that communicate through signals. Signals are discrete, time-varying sequences of values. An HLMS generally provides abstractions to support implementing synchronous designs without requiring the specification of explicit references to clocks or clock signals. Instead of providing a detailed, event driven simulation, an HLMS may also provide abstractions wherein clock-synchronous state changes are scheduled to occur at regular intervals and in which there is no notion of the timing characteristics related to the intended implementation as an electronic circuit. In further support of creating high-level designs, an HLMS may also represent state in terms of numerical (or other abstract) values instead of representing state in a detailed format analogous to standard logic vectors.

An HDL generally supports the detailed specification of timing characteristics and multi-valued signal states for a circuit. Example timing characteristics include propagation delays, setup times, and hold times, and example signal states include the standard binary logic types as well as strongly and weakly-driven states, a transitional state, an unknown state, and an un-initialized state. HDL simulators generally are capable of modeling such systems, which affects both the way events are handled (times at which signal states change) and the way the system state is presented at any given time. HDL simulations are typically event driven and require system inputs or outputs to be specified in terms of a standard extended type (e.g., the standard logic vectors of VHDL/IEEE 1164).

In an HLMS-based design, there may be some components that are described in an HDL. It is often desirable to simulate the HDL components while simulating the HLMS-based design. The process of incorporating an HDL simulation into an HLMS-based simulation is referred to as co-simulation.

The resources that are available in a co-simulation environment are typically limited. For example, in a hardware-based co-simulation there may be a limited number of test boards, each with a limited number of devices available for use in co-simulation. Similarly, in a software-based co-simulation there may be a limited number of processors available for use in running the co-simulation software. A system and method that address the aforementioned problems, as well as other related problems, are therefore desirable.

SUMMARY OF THE INVENTION

The various embodiments of the invention provide methods and apparatus for simulating operations of a circuit design that includes high-level components and HDL components. Groups of HDL components are associated with different co-simulation engines. The high-level components of the design are simulated in a high-level modeling system (HLMS), and the HDL components in each group are simulated on the associated co-simulation engine.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the invention support forming groups of the HDL-based components in an HLMS design and co-simulating the HDL-based components in each group on a selected co-simulation engine. This allows different types of co-simulation engines to be used during simulation, for example, both hardware-based and software-based co-simulation engines may be used. In addition, where there are limited resources available for simulating a design, for example, device resources, processors, or software licenses, grouping the HDL-based components allows the simulation to proceed using the resources that are available.

Figure 1:
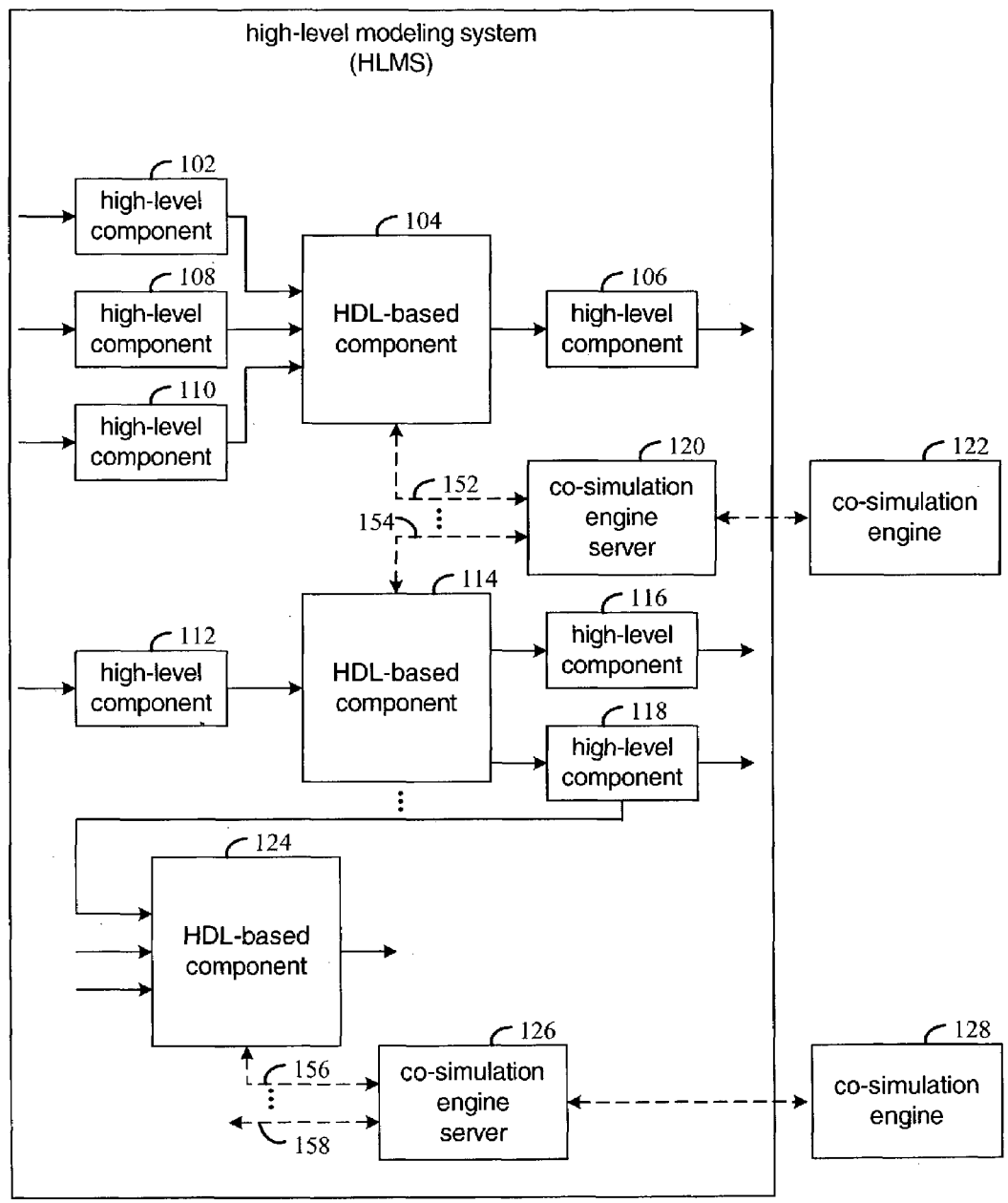
FIG. 1 is a block diagram of an example arrangement for co-simulation in accordance with various embodiments of the invention.

FIG. 1 is a block diagram of an example arrangement for co-simulation in accordance with various embodiments of the invention. The high-level modeling system (HLMS) 100 is the tool through which the user may create a high-level design that includes both high-level components and HDL-based HLMS components. The example design includes high-level components 102, 106, 108, 110, 112, 116 and 118 and HDL-based components 104, 114, and 124. High-level components 102, 108, and 110 provide input data to HDL-based component 104, which in turn provides input data to high-level component 106. High-level component 112 provides input data to HDL-based component 114, which provides input data to the high-level components 116 and 118, and high-level component 118 provides input data to HDL-based component 124.

The HDL-based components may be viewed as black boxes from the perspective of the HLMS. That is, the black boxes provide a well-defined function within the context of the high-level design but the way in which the function is implemented is not visible through the HLMS. The application/patent entitled, "HDL CO-SIMULATION IN A HIGH-LEVEL MODELING SYSTEM", filed concurrent herewith, by Milne et al., and assigned to the assignee of the present invention describes various techniques for co-simulating HDL-based components in an HLMS and is incorporated herein by reference.

The co-simulation engine servers 120 and 126 may be instantiated in response to user controls. Each co-simulation engine server provides an interface between the HLMS and the associated co-simulation engines 122 and 128, respectively. In addition, each co-simulation engine server provides a user interface for setting configuration parameters associated with the co-simulation engine. The user-configurable parameters are specific to each co-simulation engine, for example, card slot information for hardware-based co-simulation engines.

The co-simulation engine servers 120 and 126 are not part of the design, even though the blocks that represent the servers are visible to the user in the HLMS. When a user adds an HDL-based component to the design, the user may also associate the component with a co-simulation engine server. Example associations are illustrated as dashed lines 152, 154, 156, and 158. In simulating an HDL-based component, the association of the HDL-based component to a co-simulation engine server directs which co-simulation engine on which the HDL-based component will be simulated.

Different co-simulation engine servers may be used to interface with different types of co-simulation engines. For example, one co-simulation engine server may be configured to interface with a software-based co-simulation engine such as the ModelSim simulator, and another co-simulation engine server may be configured to interface with a hardware-based co-simulation engine such as an FPGA platform.

One of the tasks performed by a co-simulation engine server is to provide an interface between the HLMS and a co-simulation engine. The interface processing includes providing events to the co-simulation engine for processing. In one embodiment, each event from the HLMS is forwarded to the co-simulation engine upon arrival at the co-simulation engine server. In another embodiment, the events are queued by the co-simulation engine server, and the co-simulation engine server waits until the HLMS requires output data from the HDL-based component before submitting the queued events to the co-simulation engine. This helps to reduce the overhead involved in interfacing between the HLMS and the co-simulation engine.

The application/patent entitled, "CO-SIMULATION INTERFACE", filed concurrent herewith, by Milne et al., and assigned to the assignee of the present invention describes various techniques for interfacing an HLMS with an HDL co-simulation engine during simulation and is incorporated herein by reference.

Figure 2:
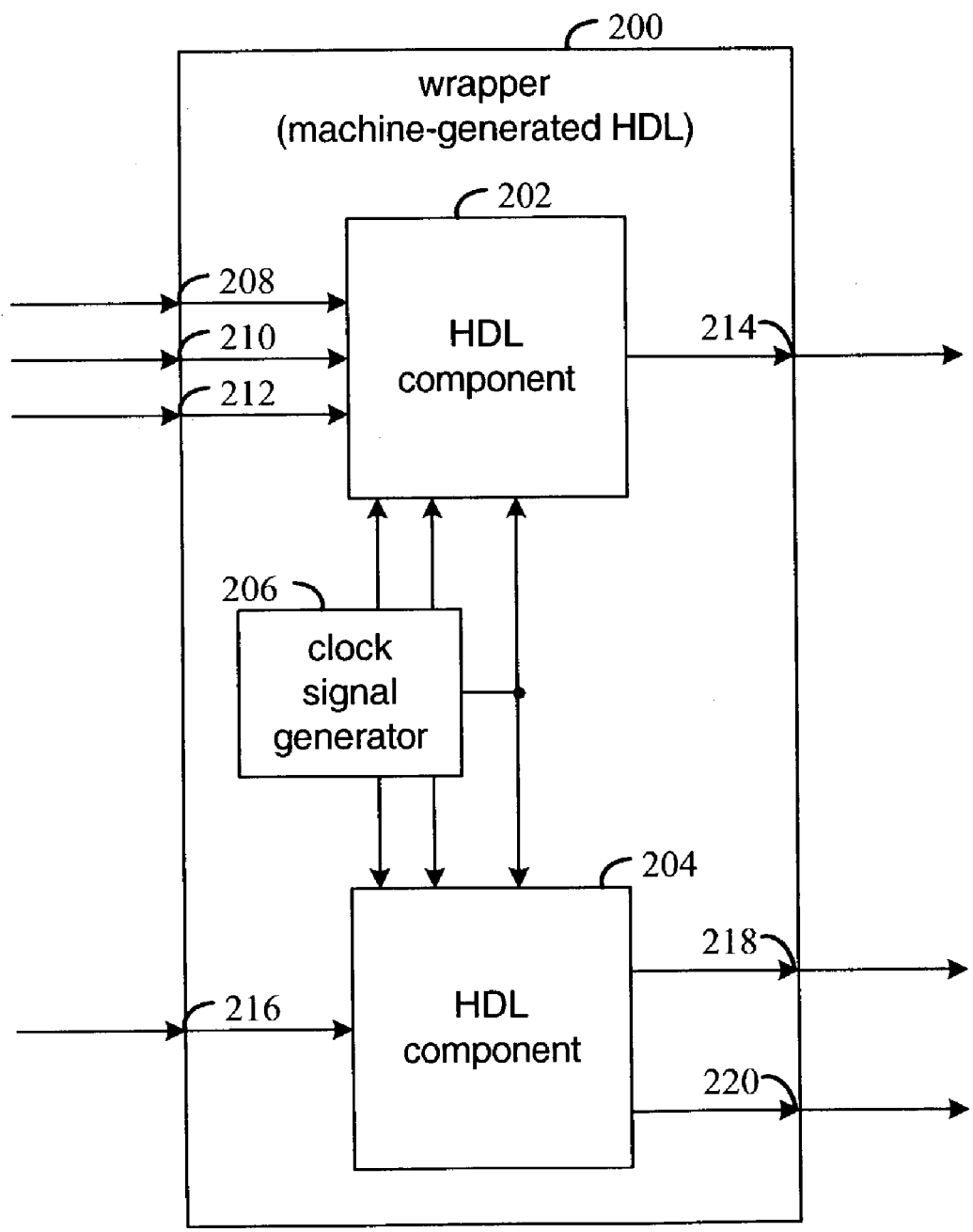
FIG. 2 is a block diagram of an HDL wrapper generated for grouping HDL components for co-simulation.

FIG. 2 is a block diagram of an HDL wrapper 200 generated for grouping HDL components for co-simulation. The HDL components 202 and 204 represent the HDL code that implements HDL-based components in the HLMS. In the example, HDL component 202 corresponds to HDL-based component 104 (FIG. 1) in the HLMS, and HDL component 204 corresponds to HDL-based component 114 in the HLMS.

At simulation time, the HLMS generates an HDL wrapper 200 for each group of HDL components to be simulated by a co-simulation engine. In one embodiment, wrappers may be saved from one simulation to the next. If the target co-simulation engine is hardware-based, an additional HDL wrapper (not shown) that encompasses wrapper 200 may be generated in order to provide an interface between wrapper 200 and board-level control circuitry.

A clock signal generator 206 is included in the wrapper. The clock signal generator is used to step the co-simulation engine and synchronize the HDL components with each other and with the HLMS. The HDL code of the HDL-based components is examined to determine the necessary clock and clock-enable signals to be provided by the clock signal generator 206. The "HDL CO-SIMULATION IN A HIGH-LEVEL MODELING SYSTEM" application/patent further describes generation of the clock signal generator. If the co-simulation engine is software-based, the clock/control driver generates signals on its own, but in a hardware-based co-simulation engine may require an input clock signal from the host device.

In support of co-simulation in the various embodiments of the invention, the data rate of input data from the HLMS to an HDL component and a maximum response time are used for scheduling events in the HDL simulator. The data rate is the rate at which units of data are provided by the HLMS components. If any input stimulus supplied to an HDL component at time $t_0$ and held constant for all time, regardless of the system state at time $t_0$, results in the output states of the HDL component being constant for all time after $(t_0+T)$, then the maximum response time of the HDL component is T. For multiple HDL components within a wrapper, the maximum response time is the greatest of the maximum response times of those HDL components that share a clock/control driver. The maximum response time may be determined by analyzing the HDL components using known tools.

All clock signal periods and clock enable signal periods are scaled on the order of $T_1$, where $T_1 >> T$. For certain co-simulation engines, e.g., for hardware-based engines, $T_1$ may be chosen instead in terms of arbitrary external time scales (e.g., related to the HLMS simulation process). In an example embodiment, $T_1$ is selected (for the design under simulation) to be large enough to account for an expected maximum number of events to be processed by the HDL co-simulation engine in any one HLMS timeslot. The clock and clock enable signals may also be generated via processes that do not produce regular, periodic signals. For co-simulation engines that can construct and display waveforms for the designer, for example, the ModelSim simulator, it is desirable to choose a $T_1$ that can be related to the HLMS simulation and also to generate all clock and clock-like clock enable signals such that they are seen as cyclic signals (and appropriately related one to another) within the co-simulation engine. This is accomplished by creating clock/control drivers as non-synthesizable HDL and by having those signals generated in terms of absolute time, parameterized by the time scale $T_1$.

By choosing an appropriate linear relationship between the timescales used by the HLMS and the HDL co-simulation engine (e.g., each unit of time in the HLMS corresponds to a K units of time of the co-simulation engine on the order of $T_1$), the wrapped HDL components may be simulated in lockstep with each other and with the HLMS simulation. This simplifies the scheduling of time-step events for the HDL co-simulation engine. The wrapped HDL components may also share common clock generators and align the simulations in time, thereby making the behaviors comprehensible when viewed together in a waveform viewer.

The HDL wrapper includes input and output ports corresponding to the input and output ports of the individual HDL components 202 and 204. For example, the wrapper includes input ports 208, 210, and 212, and output port 214 for HDL component 202. Similarly, input port 216 and output ports 218 and 220 are provided for HDL component 204.

Figure 3:
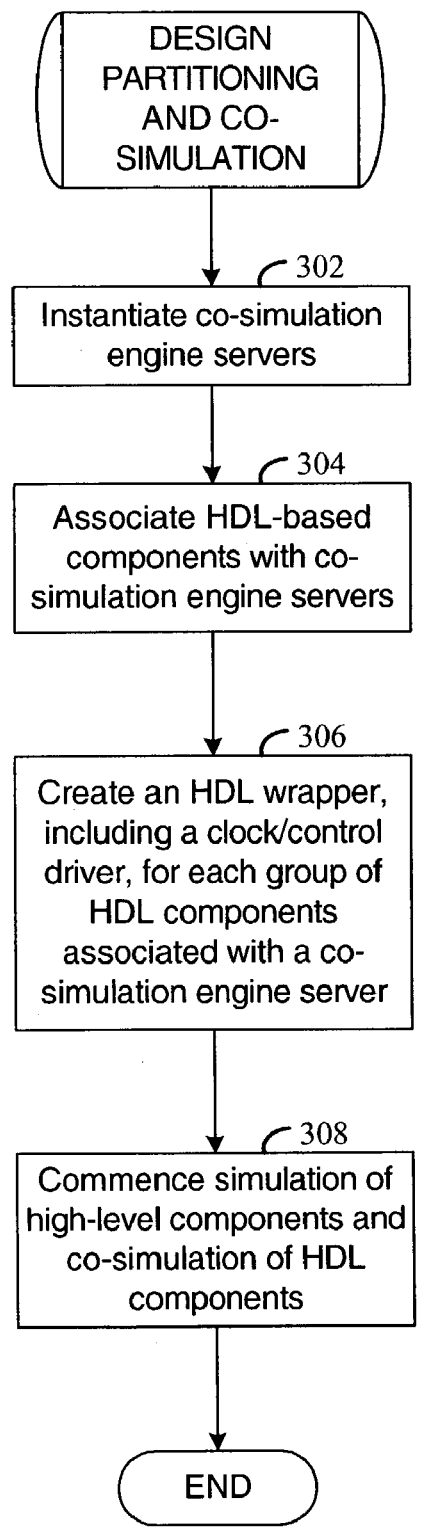
FIG. 3 is a flowchart of an example process for partitioning a design including high-level and HDL-based components for co-simulation.

FIG. 3 is a flowchart of an example process for partitioning a design including high-level and HDL-based components for co-simulation. Once a design has been specified, co-simulation may be performed to determine whether the design will operate as required. In one embodiment, the HLMS provides one or more co-simulation engine server classes from which co-simulation engine servers may be instantiated (step 302). The types of co-simulation engine servers that are instantiated are selected based on the types of co-simulation engine to be connected. For example, co-simulation engine servers may be provided for hardware-based and software-based co-simulation engines.

Each HDL-based component is then associated with at least one of the co-simulation engine servers (step 304). The co-simulation engine server with which the HDL component is associated determines which co-simulation engine that will be used to simulate the HDL code that implements the HDL-based component. The co-simulation engines that are available in an environment will vary according to users' needs and business objectives. Similarly, the associations between HDL-based components and engine servers that are established by the user will vary according to the simulation objectives and the co-simulation engines that are available.

When simulation is initiated, the HLMS initially creates an HDL wrapper for each group of HDL components associated with a co-simulation engine server (step 306). The HDL components implement the HDL-based components in the HLMS. Each wrapper includes a clock/control driver that is generated based on the clock and clock-based control signal requirements of the various HDL components in the group. In addition, each wrapper includes the input and output ports required by each of the HDL components. Once the wrappers are created, the simulation of the high-level components and co-simulation of the HDL components is commenced (step 308).

Figure 4:
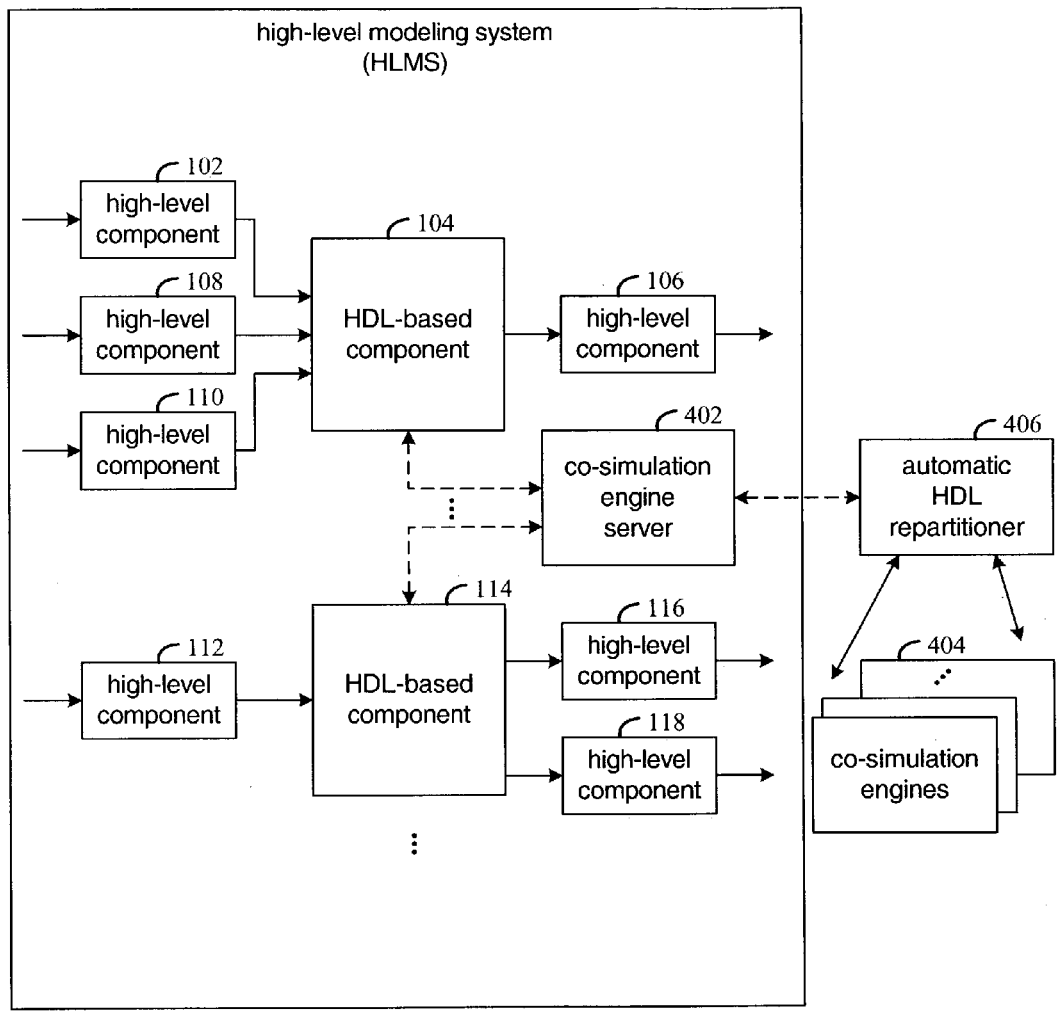
FIG. 4 is a block diagram of an example arrangement for automatically partitioning a design for co-simulation.

FIG. 4 is a block diagram of an example arrangement for automatically partitioning a design for co-simulation. Instead of manually selecting which HDL components are to be simulated on which co-simulation engines, an automated procedure is used to divide the co-simulation work between multiple co-simulation engines based on the resource needs of the HDL components and the resources provided by the co-simulation engines.

For purposes of illustration a portion of the example design from FIG. 1 is replicated in the HLMS of FIG. 4. The replicated portion includes high-level components 102, 106, 108, and 110 connected to HDL-based component 104, and high-level components 112, 116, and 118 connected to HDL-based component 114.

A co-simulation engine server 402 is instantiated to provide an interface to a set of co-simulation engines. For example, co-simulation engine server 402 interfaces with co-simulation engines 404, via automatic HDL partitioner 406, where co-simulation engines 404 can either all be of the same type or be of mixed type. Each co-simulation engine server provides an interface for collectively configuring the co-simulation engines 404, and for individually configuring the co-simulation engines as necessary. The user specifies the set of HDL-based components that are associate with each co-simulation.

The automatic HDL partitioner 406 examines the resource requirements of the HDL components that the user has assigned to the server and evaluates the resources that are available in a group of co-simulation engines 404 with which the partitioner is responsible for interfacing. Based on the resource requirements of each HDL component and the resources available in each of the co-simulation engines, the automatic HDL partitioner selects which HDL components are to be simulated on which co-simulation engines. Example resources in a hardware-based co-simulation engine include memory, I/O ports, and configurable logic blocks of an FPGA.

The automatic HDL partitioner may create groups of HDL components based on the resource requirements and resource availability of the co-simulation engines. Thus, the automatic HDL partitioner is responsible for creating the wrapper HDL (e.g., 200 of FIG. 2) for each group of HDL components.

The interface between the partitioning co-simulation engine and automatic HDL partitioner is the same as the interface between the HDL partitioner and the co-simulation engines. Thus, to the HLMS each type of co-simulation engine appears as a generic co-simulation engine through the presentation of a common co-simulation engine interface. The "CO-SIMULATION INTERFACE" application/patent describes an example generic co-simulation engine interface. The generic engine interface allows the automatic HDL partitioner to query the individual co-simulation engines as to their capabilities and resource limitations. The co-simulation interface includes program callable functions for configuring and querying a co-simulation engine, instructing the co-simulation engine to compile specified HDL, instantiating a simulation instance, and functions involved in the actual simulation of a design.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for simulating electronic circuit designs and has been found to be particularly applicable and beneficial in simulating in a high-level modeling system the high-level components of a design and co-simulating HDL components of the design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for simulating operations of a circuit design that includes high-level components and HDL components, comprising:

associating each group of a plurality of groups of HDL components with a co-simulation engine of a plurality of co-simulation engines, wherein each group of the plurality of groups has one or more HDL components;

instantiating a plurality of co-simulation engine servers, each co-simulation engine server configured to provide an interface between the high-level components and HDL components being co-simulated on the associated co-simulation engine;

generating by a high-level modeling system (HLMS) upon initiation of simulation, an HDL wrapper for each group of HDL components, the HDL wrapper including a clock-and-control component that drives each HDL component in the group during co-simulation;

simulating the high-level components of the design in the (HLMS); and co-simulating the HDL components in each group on the associated co-simulation engine.

2. The method of claim 1, wherein two or more of the co-simulation engine servers provide an interface to different types of HDL co-simulation engines.

3. The method of claim 2, wherein the different types of HDL co-simulation engines include software-based HDL co-simulation engines and hardware-based HDL co-simulation engines.

4. The method of claim 1, further comprising automatically selecting a co-simulation engine for each HDL component as a function of resources provided by the co-simulation engine and resources required by the HDL component.

5. The method of claim 4, further comprising querying, via a programming interface common to each co-simulation engine, each co-simulation engine for capabilities of the engine.

6. The method of claim 5, further comprising configuring, via a programming interface common to each co-simulation engine, each co-simulation engine.

7. The method of claim 6, further comprising instructing, via a programming interface common to each co-simulation engine, a selected co-simulation engine to compile specified HDL code.

8. An apparatus for simulating operations of a circuit design that includes high-level components and HDL components, comprising:

means for associating groups of HDL components with co-simulation engines;

means for instantiating a plurality of co-simulation engine servers, each co-simulation engine server configured to provide an interface between the high-level components and HDL components being co-simulated on the associated co-simulation engine;

means for generating by a high-level modeling system (HLMS) upon initiation of simulation, an HDL wrapper for each group of HDL components, the HDL wrapper including a clock-and-control component that drives each HDL component in the group during co-simulation;

means for simulating the high-level components of the design in a high-level modeling system (HLMS); and means for co-simulating the HDL components in each group on the associated co-simulation engine.

9. A method for simulating operations of a circuit design that includes a plurality of high-level components and a plurality of HDL components, comprising:

simulating the high-level components of the design in a high-level modeling system (HLMS);

co-simulating a plurality of HDL components on a plurality of co-simulation engines in response to a user design that specifies co-simulation of the HDL components;

interfacing the high-level components with the HDL components via a plurality of co-simulation engine servers executing as high-level components in the HLMS;

assigning at least one HDL component to one of the co-simulation engine servers in response to user input; and providing a user interface associated with each co-simulation engine server through which hardware resource requirements of the at least one assigned HDL component are configurable.

10. The method of claim 9, further comprising providing in the user interface associated with each co-simulation engine server a configurable parameter for specification of memory requirements.

11. The method of claim 9, further comprising providing in the user interface associated with each co-simulation engine server a configurable parameter for specification of a number of ports for input and output of data.

12. The method of claim 9, further comprising providing in the user interface associated with each co-simulation engine server a configurable parameter for specification of a number of configurable logic blocks of a field programmable gate array (FPGA).

13. The method of claim 9, wherein interfacing comprises providing simulation events from the HLMS to the co-simulation engines.

14. The method of claim 13, further comprising:

queuing the simulation events by a co-simulation engine server; and submitting queued simulation events from a co-simulation engine server to an associated co-simulation engine in response to an event from the HLMS that requests output data from the assigned HDL component.

15. The method of claim 9, wherein at least one of the co-simulation engines is a software-based co-simulation engine at least one of the co-simulation engines is a hardware-based co-simulation engine.

* * * * *